(12) United States Patent
Nakanishi et al.

(10) Patent No.: US 7,944,681 B2
(45) Date of Patent: May 17, 2011

(54) ELECTRICAL JUNCTION BOX

(75) Inventors: Ryuji Nakanishi, Yokkaichi (JP); Kazuhiro Asada, Yokkaichi (JP)

(73) Assignee: Sumitomo Wiring System, Ltd., Yokkaichi (JP)

( * ) Notice: Subject to any disclaimer, the term of this patent is extended or adjusted under 35 U.S.C. 154(b) by 126 days.

(21) Appl. No.: 12/382,810

(22) Filed: Mar. 24, 2009

(65) Prior Publication Data
US 2009/0294172 A1   Dec. 3, 2009

(30) Foreign Application Priority Data

May 30, 2008   (JP) .................................. 2008-143307

(51) Int. Cl.
*H02B 1/26* (2006.01)
*H05K 7/20* (2006.01)
*H01R 12/00* (2006.01)

(52) U.S. Cl. ........ 361/641; 361/704; 361/710; 439/76.2

(58) Field of Classification Search .................. 361/622, 361/641
See application file for complete search history.

(56) References Cited

U.S. PATENT DOCUMENTS

| | | | | |
|---|---|---|---|---|
| 5,646,827 A * | 7/1997 | Hirao et al. | ................... | 361/707 |
| 6,244,877 B1 * | 6/2001 | Asao | ............................ | 439/76.2 |
| 6,724,627 B2 * | 4/2004 | Onizuka et al. | ............... | 361/704 |
| 6,785,139 B2 * | 8/2004 | Onizuka et al. | ............... | 361/704 |
| 7,099,155 B2 * | 8/2006 | Kobayashi et al. | .......... | 361/719 |
| 7,122,928 B2 * | 10/2006 | Shindo | ............................ | 310/89 |
| 7,672,116 B2 * | 3/2010 | Li et al. | ........................ | 361/641 |
| 2001/0003070 A1 * | 6/2001 | Asao | ............................ | 439/76.2 |
| 2003/0137813 A1 * | 7/2003 | Onizuka et al. | ............... | 361/777 |
| 2004/0141292 A1 * | 7/2004 | Onizuka et al. | ............... | 361/704 |
| 2004/0145860 A1 * | 7/2004 | Shindo | ........................ | 361/622 |

FOREIGN PATENT DOCUMENTS

JP    A-8-274421    10/1996

* cited by examiner

*Primary Examiner* — Gregory D Thompson
(74) *Attorney, Agent, or Firm* — Oliff & Berridge, PLC

(57) ABSTRACT

This invention provides an electrical junction box that can restrain a temperature from increasing in a casing. An electrical junction box comprises a casing made of a synthetic resin material, a circuit board contained in the casing, semiconductor relay mounted on the circuit board, a bus bar. The bus bar is insert-molded in the casing. The bus bar includes an embedment section embedded in the casing, and a connecting section that is not embedded in the casing and thermally connected to the semiconductor relay.

3 Claims, 13 Drawing Sheets

ELECTRICAL JUNCTION BOX

The present invention claims priority to JP 2008-143307 filed in Japan on May 30, 2008, the entire disclosure of which is incorporated by reference in its entirety.

BACKGROUND

1. Technical Field

This invention relates to an electrical junction box.

2. Background Art

Heretofore, an example of an electrical junction box has been known in JP HEI 8(1996)-274421 A. This electrical junction box contains a circuit board in a casing. A heat generation part, such as a power transistor or the like, is mounted on the circuit board. A lead of the heat generation part is connected through a solder to a bus bar disposed on the circuit board.

FIG. 13 schematically shows a heat transmission path in a conventional electrical junction box. As shown in FIG. 13, heat generated from a heat generation part 110 during electrical conduction is transmitted from a lead 111 of the heat generation part 110 through a solder 112 to a bus bar 113. The heat transmitted to the bus bar 113 is radiated into air 114 in a casing 115, the heat is then transmitted from the air 114 to the casing 115. The heat transmitted to the casing 115 is then radiated from an outer side surface of the casing 115 to a casing outside 116. Thus, it has been expected to effectively radiate the heat generated from the heat generation part 110 to the casing outside 116.

However, in junction boxes based on the above construction, the heat transmitted to the bus bar 113 is radiated through a layer of air 114 in the casing 115. Since air 114 has a relatively low coefficient for heat conduction, heat accumulates in the casing 115 resulting in a temperature increase in the casing 115. Consequently, an electronic part mounted on the circuit board may malfunction, or the reliability in the solder connection may be lowered.

In view of the above problems, an object of the present invention is to provide an electrical junction box that can restrain a temperature from increasing in a casing.

SUMMARY

An electrical junction box in accordance with the present invention consists of a casing made of a synthetic resin material, a circuit board contained in the casing, a heat generation part mounted on the circuit board, and a heat radiation plate is insert-molded in the casing. The heat radiation plate includes an embedment section embedded in the casing and a connecting section exposed from the casing and thermally connected to the heat generation part.

Heat generated from the heat generation part during use is transmitted to the connecting section of the heat radiation plate. The heat transmitted to the connecting section is transmitted through the heat radiation plate to the embedment section. The heat transmitted to the embedment section is directly transmitted from an outer surface of the embedment section to the casing. The heat transmitted to the casing is uniformly transmitted through the entire casing 11. Thereafter, the heat is radiated away from the outer surface of the casing.

Thus, according to an exemplary embodiment of the present invention, in the process of radiating heat from the heat generation part to the outside of the casing, there is no intermediate layer of air which has a lower coefficient of heat between the casing and the heat generation part. Consequently, since it is possible to prevent heat from being accumulated in the casing, it is possible to restrain a temperature from increasing in the casing.

The words "thermally connected" mean that the heat generation part and connecting section are directly connected to each other or they are indirectly connected through an intermediate heat conducting member and the heat generated from the heat generation part is under a condition that can be transmitted to the connecting section or under a condition that the heat can be moved between them by means of heat radiation.

The following constructions are preferable as embodiments of the present invention.

An electrical conductive path may be formed on the circuit board by means of a printed wiring process. A lead from the heat generation part may be connected to the electrical conductive path. The connecting section of the heat radiation plate may be connected to the electrical conductive path near a position where the lead is connected to the electrical conductive path.

According to the above construction, the heat generated from the heat generation part is transmitted from the lead to the electrical conductive path and from the electrical conductive path to the connecting section. Because the electrical conductive path and connecting section are interconnected to each other near a position where the lead is connected to the electrical conductive path, the heat is relatively smoothly transmitted from the lead to the connecting section. Consequently, since it is possible to restrain heat from accumulating in the electrical conductive path, it is possible to restrain temperature from increasing in the casing.

A plurality of heat radiation plates may be insert-molded in the casing, and the heat radiation plates may be connected to the electrical conductive path connected to the lead of the heat generation part.

According to the above construction, after the heat generated from the heat generation part is transmitted to the electrical conductive path, the heat is transmitted to the plural heat radiation plates. Thus, it is possible to enhance heat radiation when compared with heat transmission using a single heat radiation plate.

The embedment section of the heat radiation plate may be disposed in the casing at a position opposed to the heat generation part.

According to the above construction, heat generated from the heat generation part flows to an area of the casing opposite the heat generation part by means of radiation. Thereafter, the heat in the casing is conducted from the casing to the embedment section of the heat radiation plate. The heat is then transmitted from the embedment section to the heat radiation plate to be uniformly distributed. Thus, the heat generated from the heat generation part is uniformly distributed.

A bus bar that is electrically connected to the circuit board may be contained in the casing. The bus bar may be formed integrally with the heat radiation plate.

According to the above construction, since the bus bar is integrated with the heat generation plate, it is possible to save space in comparison with cases in which the bus bar is separate from the heat radiation plate.

The bus bar may also be disposed on the circuit board in a substantially vertical direction.

According to the above construction, it is possible to reduce a projected area in a direction intersecting the surface of the circuit board in comparison with the case where the bus bar is disposed in parallel to the surface of the circuit board.

A plurality of terminal metals may be juxtaposed on the circuit board, and the bus bar may be disposed in a clearance between the terminal metals.

Heretofore, the clearance between the juxtaposed plural terminal metals has not been used and thus the clearance has become a dead space. According to the above construction, since it is possible to dispose the bus bar by effectively utilizing the clearance between the plural terminal metals, it is possible to enhance an efficiency of space.

A plurality of connector housings may be partitioned by bulkheads to be juxtaposed in the casing. Each connector housing may be adapted to be coupled to a mating connector. The bus bar may be insert-molded in the bulkhead.

Heretofore, nothing has been disposed in the interior of the bulkheads for partitioning the plural connecting housings and the bulkheads have become a dead space. According to the above construction, since it is possible to dispose the bus bar in the interior of the bulkheads, it is possible to enhance an efficiency of space.

The bus bar and heat radiation plate may be thermally connected to the heat generation part.

According to the above construction, since the bus bar and heat radiation plate can transmit the heat from the heat generation part, it is possible to enhance a heat radiation function as a whole.

The bus bar may constitute an electrical power line for supplying an electrical power from an electrical power source to the circuit board.

A relatively great amount of electrical current is supplied to the electrical power line to which an electrical power from an electrical power source is supplied. Consequently, the electrical power line generates heat. According to the above construction, the heat generated upon electrical conduction from the bus bar that constitutes the electrical power line is transmitted to the casing and then is radiated to the outside of the casing. Thus, it is possible to enhance a heat radiation function as a whole.

The casing may be provided on an inner surface of a bottom wall with a slope. The slope may be provided in the lowest part with a drainage port so that water in the casing is drained outside. The casing may be formed in a liquid-tight manner at an area different from the drainage port.

For example, water is dew-formed in the casing. The dew-formed water flows toward the bottom wall of the casing, flows on the slope on the bottom wall, and is drained out from the casing through the drainage port that is open at the lowest part.

Since the casing is formed in a liquid-tight manner except the drainage port, it is possible to restrain water from entering the casing through a portion different from the drainage port.

However, in the case where the casing is formed in liquid-tight manner except the drainage port, as constructed above, air hardly flows between the interior of the casing and the exterior of the casing. Even if the present invention utilizes the casing that is likely to accumulate heat, it is possible to restrain a temperature from increasing in the casing.

The heat generation part may be a semiconductor relay.

Even if the semiconductor relay having a great amount of heat generation is used as a heat generation part, it is possible to restrain a temperature from increasing in the casing.

According to the present invention, it is possible to restrain heat from increasing in the casing.

DETAILED DESCRIPTION OF EMBODIMENTS

Figure 1:
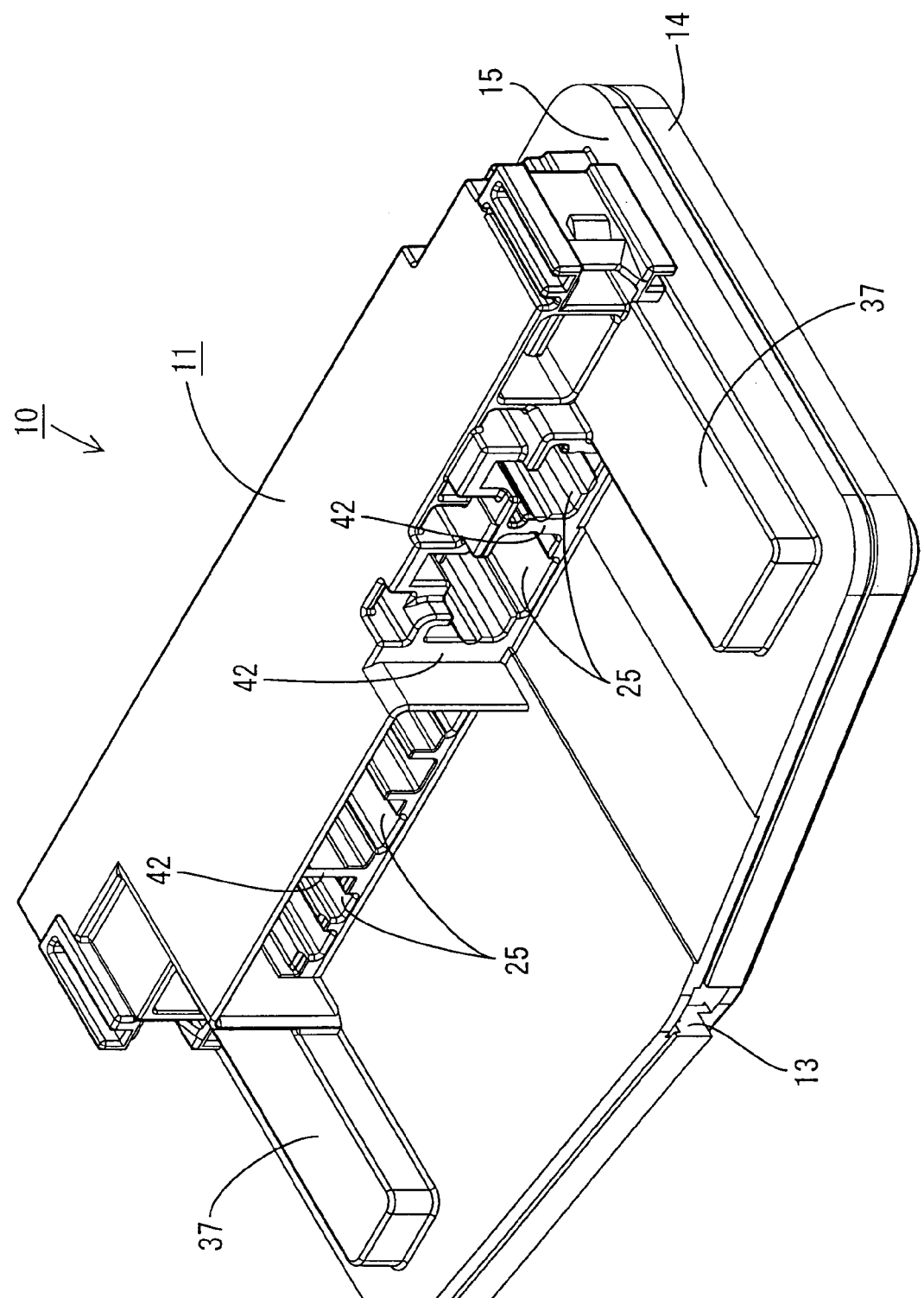
FIG. 1 is a general perspective view of an embodiment of an electrical junction box in accordance with the present invention.
Figure 2:
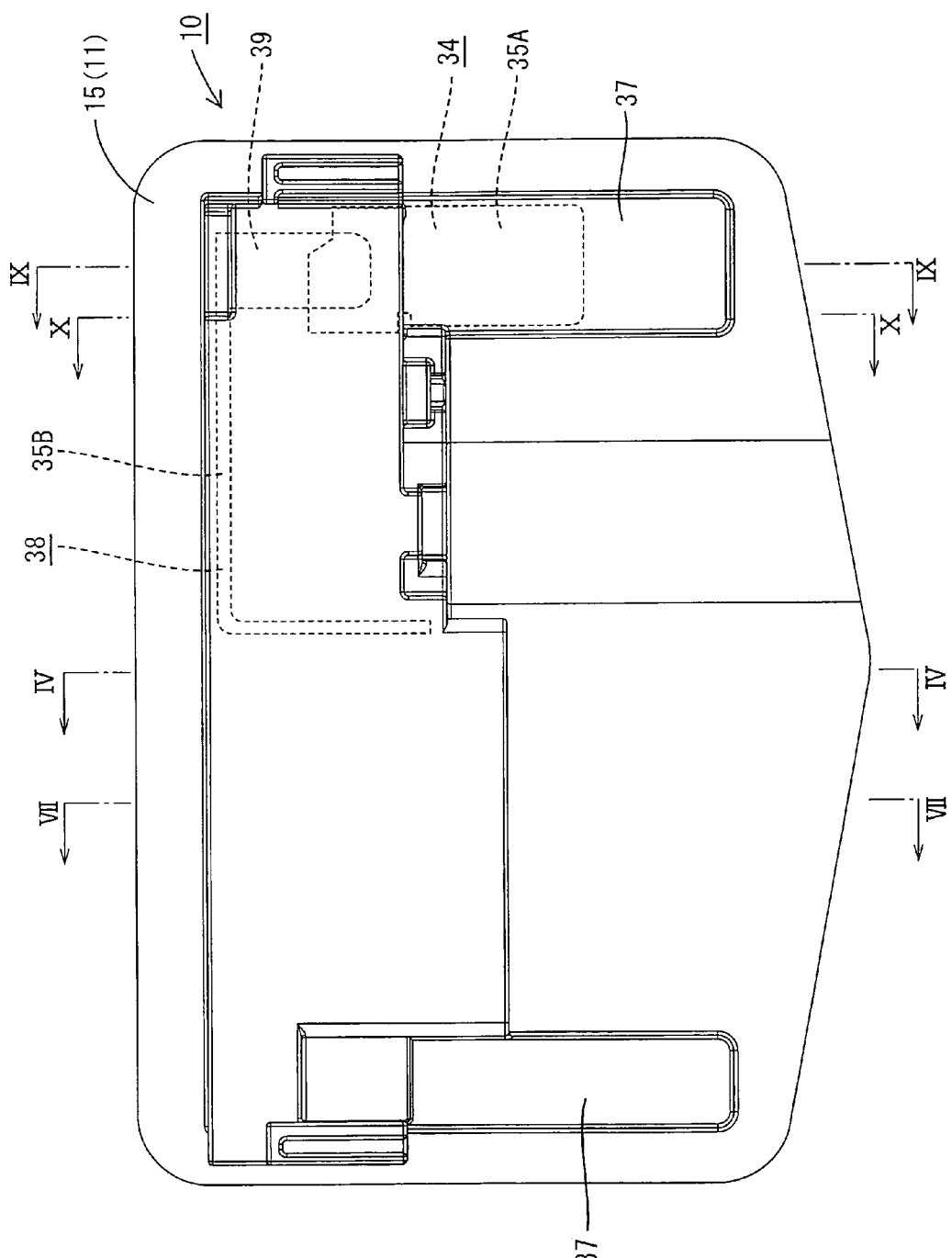
FIG. 2 is a front elevation view of the electrical junction box shown in FIG. 1.
Figure 3:
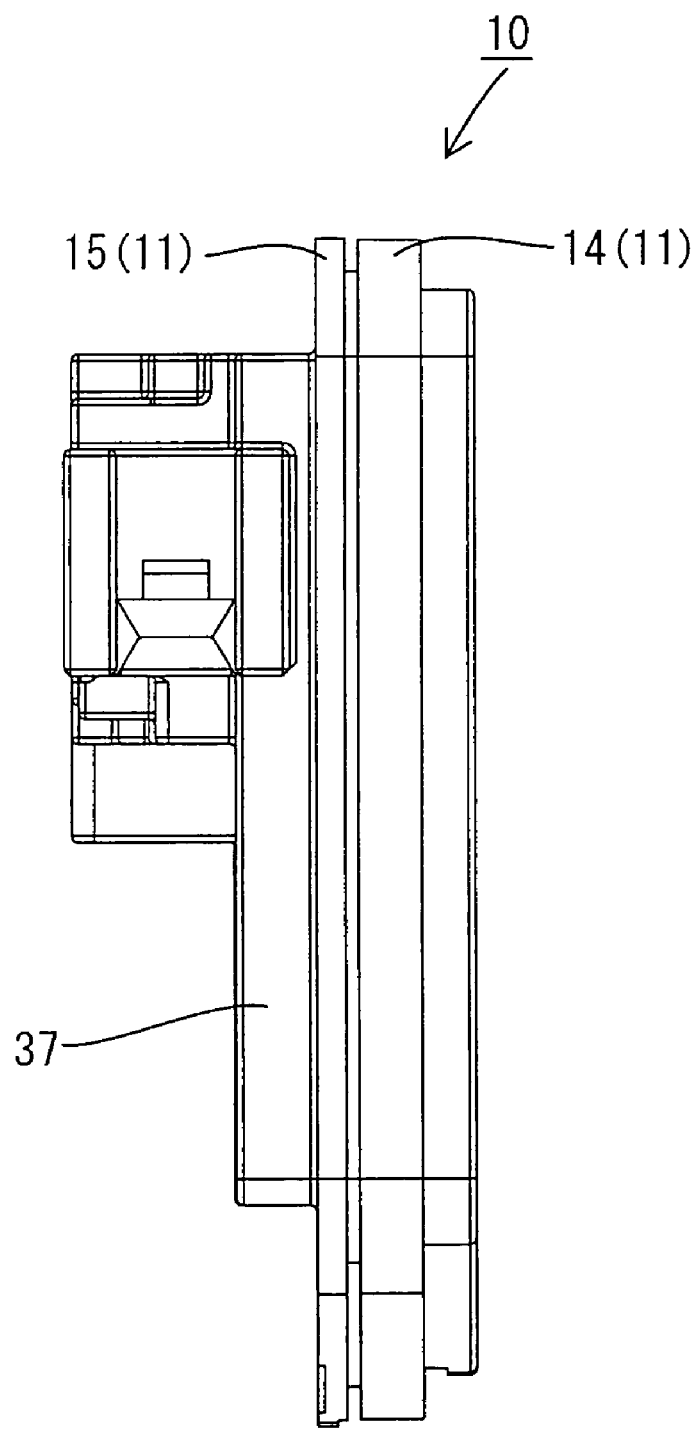
FIG. 3 is a side elevation view of the electrical junction box shown in FIG. 1.

Referring to FIGS. 1 to 11, an exemplary embodiment of an electrical junction box 10 to be mounted in a motor vehicle (not shown) is described below. An embodiment of the electrical junction box 10 in accordance with a preferred embodiment contains a circuit board 12 in a casing 11. The electrical junction box 10 is disposed between an electrical power source (not shown) and on-vehicle electrical components (not shown), such as lamps, a horn, and the like so as to supply and shut out an electrical current to the on-vehicle electrical components. For convenience of explanation, hereinafter, an upper portion of FIG. 2 is defined as an "upper side" and a lower portion of FIG. 2 is defined as a "lower side." Also, a left portion of FIG. 2 is defined as a "left side" and a right portion of FIG. 2 is defined as a "right side." Also, a left portion of FIG. 3 is defined as a "front side" and a right side in FIG. 3 is defined as a "rear side."

As shown in FIG. 1, the casing 11 is formed into a flat configuration in which a width dimension taken in a right and left direction (in a direction from a right forward side to a left backward side of FIG. 1) is greater than a thickness dimension taken in a front and rear direction (in an upper and lower direction of FIG. 1). As shown in FIG. 2, the casing 11 is formed into a substantially pentagonal configuration when viewed from a front and rear direction (a direction of penetrating a paper surface in FIG. 2). A bottom wall at a lower part of the casing 11 is formed into a substantially V-shaped configuration that is inclined downward from right and left sides (right and left sides in FIG. 2) to the lowest central part. The casing 11 is provided in the lowest central part with a drainage port 13 that communicates with interior and exterior of the casing 11 (see FIG. 1). In the present embodiment, an area different from the drainage port 13 in the bottom wall of the casing 11 is not provided with an opening that communicates with the interior and exterior of the casing 11. Thus, the casing 11 is sealed in a liquid-tight manner except for the drainage port 13.

As shown in FIG. 3, the casing 11 includes a first casing member 14 made of a synthetic resin material and disposed at a rear side (a right side in FIG. 3), and a second casing member 15 made of a synthetic resin material and disposed at a front side (a left side in FIG. 3).

Figure 4:
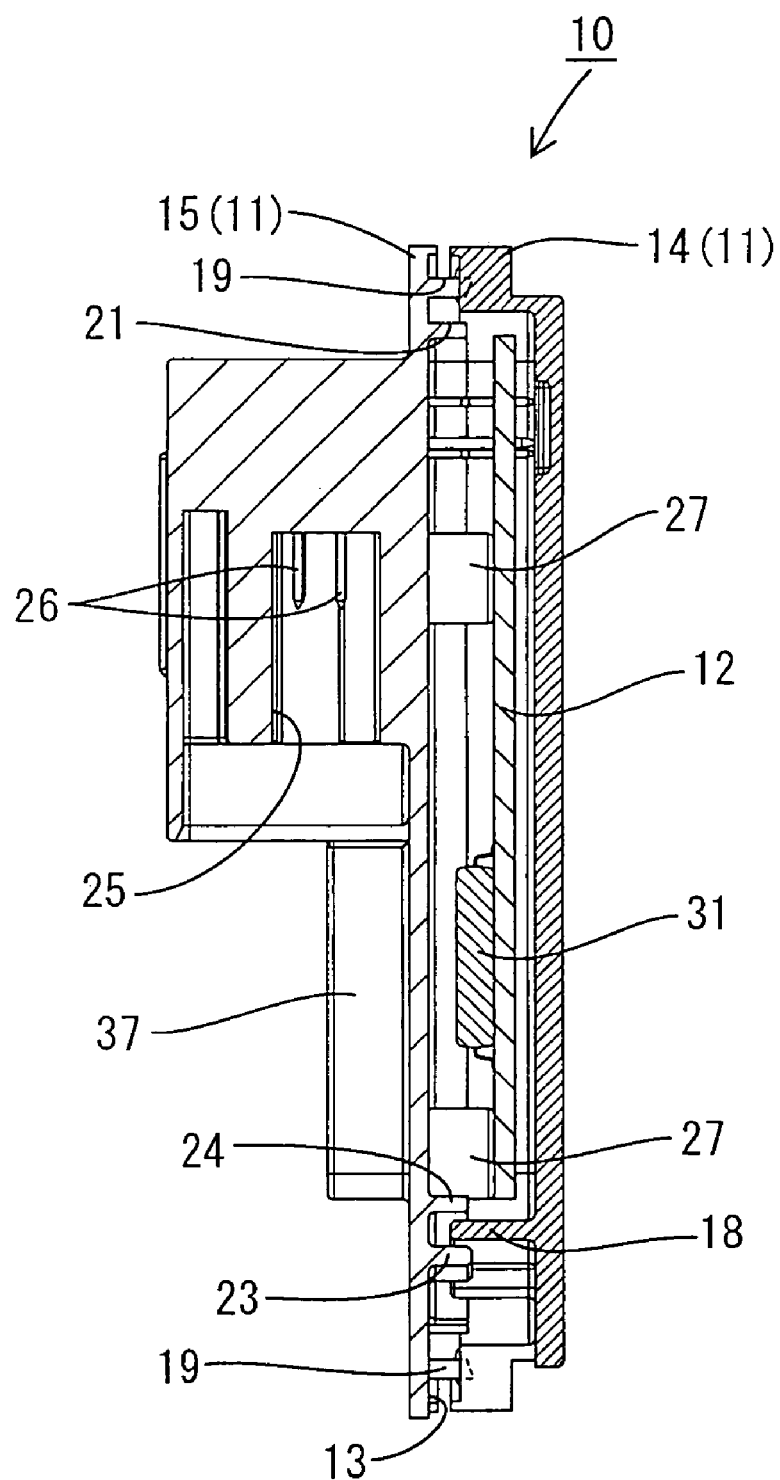
FIG. 4 is a cross section view taken along lines IV-IV in FIG. 2.
Figure 5:
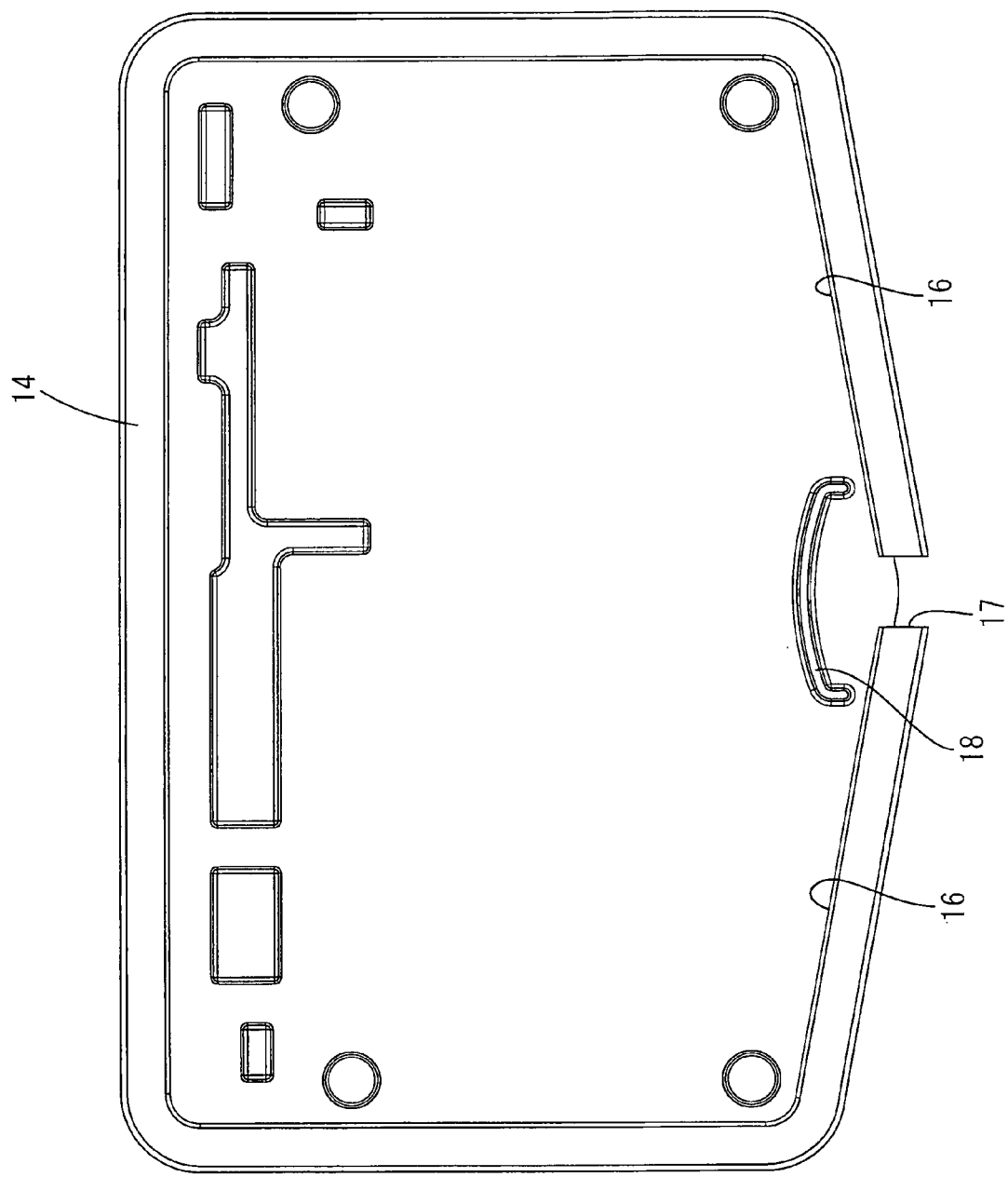
FIG. 5 is a front elevation view of a first casing member of the electrical junction box.

As shown in FIG. 4, the first casing member 14 is formed into a shallow dish-like configuration that is open at a front side (left side in FIG. 4). As shown in FIG. 5, the first casing member 14 is formed into a substantially pentagonal configuration taken in a front and rear direction (a direction of penetrating a paper surface in FIG. 5). A bottom wall of the first casing member 14 disposed at a lower part in FIG. 5 is formed into a substantially V-shaped configuration that is inclined downward from a right and left direction (a right and left direction in FIG. 5) to the lowest central part. Thus, the first casing member 14 is provided on an inner surface (an upper side surface in FIG. 5) of the bottom wall with a pair of slopes 16 that are inclined downward from right and left ends to a central part.

As shown in FIG. 5, a bottom wall of the first casing member 14 is provided in the lowest position with a first drainage port 17 that penetrates the bottom wall. The first casing member 14 is provided at a position above the first drainage port 17 (at an upper side in FIG. 5) with a first water-blocking wall 18 that projects toward a front side (a forward side in a direction of penetrating the paper surface in FIG. 5) so that the first water-blocking wall 18 covers an upper part of the first drainage port 17. The first water-blocking wall 18 is formed into an arcuate configuration that is convexed upward.

As shown in FIG. 4, the second casing member 15 is formed into a shallow dish-like configuration that is open at a rear side (a right side in FIG. 4). The second casing member 15 is integrally assembled to the first casing member 14 to close the opening in the first casing member 14. The second casing member 15 is provided on an edge around the opening with a welding wall 19 that contacts with an opening edge of the first casing member 14 at a front side (a left side in FIG. 4) and is secured to the opening edge of the first casing member 14 in a liquid-tight manner by a supersonic bonding process.

Figure 6:
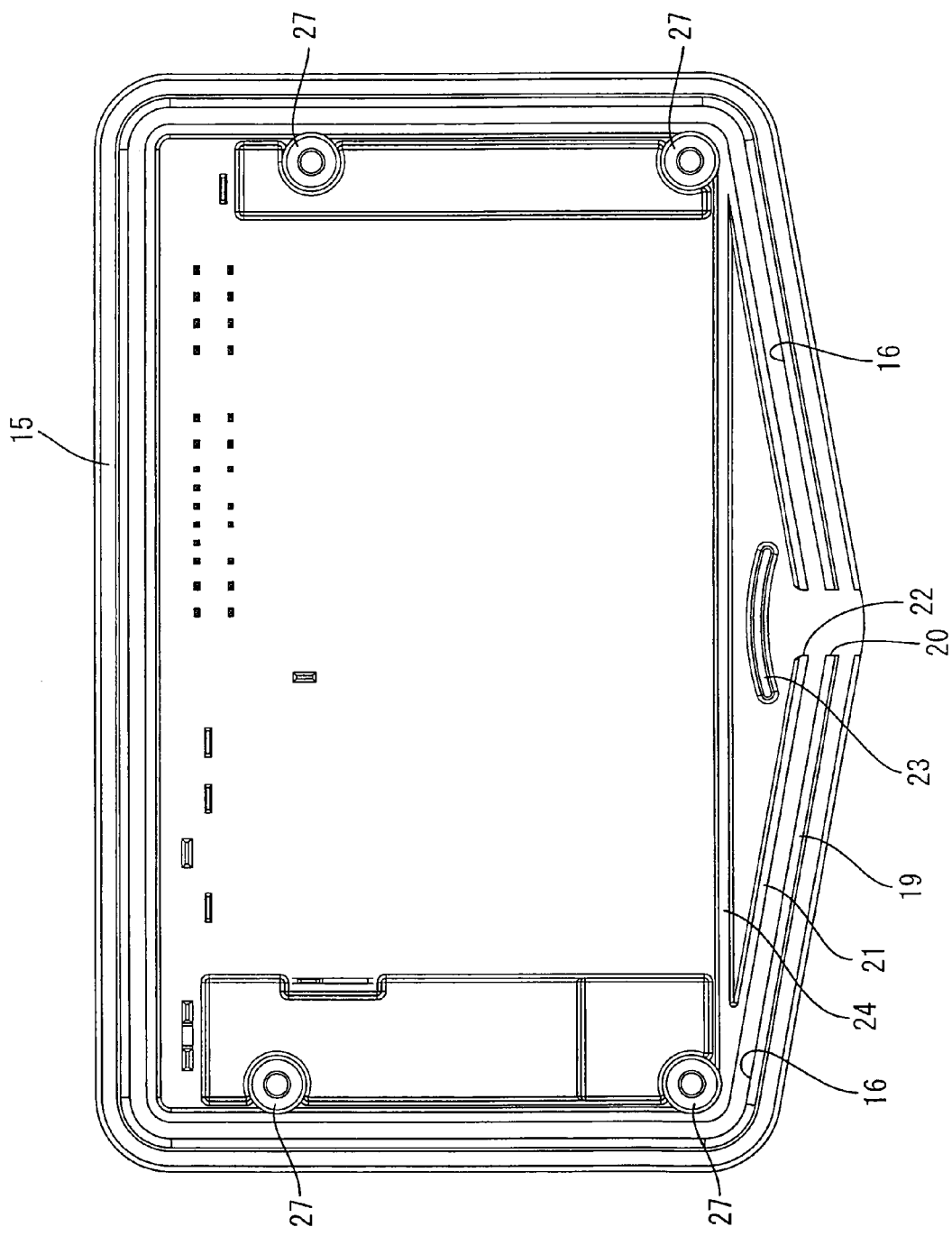
FIG. 6 is a rear elevation view of a second casing member of the electrical junction box.

As shown in FIG. 6, the second casing member 15 is formed into a substantially pentagonal configuration taken in a front and rear direction (a direction of penetrating a paper surface in FIG. 6). The welding wall 19 is formed into a substantially pentagonal configuration that is substantially similar to the configuration of the second casing member 15 taken in the front and rear direction. The welding wall 19 of the second casing member 15 disposed at a lower part in FIG. 6 defines a bottom wall of the second casing member 15. The welding wall 19 is formed into a substantially V-shaped configuration that is inclined downward from right and left ends to the lowest central part. Thus, the second casing member 15 is provided on an inner surface (an upper side surface in FIG. 6) of the bottom wall with a pair of slopes 16 that are inclined downward from right and left ends to the lowest central part.

As shown in FIG. 6, the second casing member 15 is provided in the lowest part with a second drainage port 20 that penetrates the bottom wall (the welding wall 19) of the second casing member 15.

As shown in FIG. 4, the second casing member 15 is provided in an inner position in a thickness direction of the welding wall 19 with a water-blocking rib 21 that projects toward a rear side (a right side in FIG. 4). As shown in FIG. 6, the water-blocking rib 21 is formed into a substantially pentagonal configuration that is substantially similar to the welding wall 19 and is smaller than the welding wall 19. The water-blocking rib 21 can restrain water from entering the casing 11.

The water-blocking rib 21 is cut off at the lowest position corresponding to the second drainage port 20 to define a cutoff portion 22. The second casing member 15 is provided on a position above the second drainage port 20 and cutoff portion 22 (at an upper side in FIG. 6) with a second water-blocking wall 23 that projects toward a rear side (a front side in a direction of penetrating a paper surface in FIG. 6) to cover upper parts of the second drainage port 20 and cutoff portion 22. The second water-blocking wall 23 is convexed upward. The second water-blocking wall 23 is provided on an upper part with a partition wall 24 that projects toward a rear side (a front side in a direction of penetrating a paper surface in FIG. 6) and extends in the a right and left direction so as to be connected to the water-blocking rib 21.

As shown in FIG. 4, when the first casing member 14 and second casing member 15 are interconnected to each other, the first drainage port 17 in the first casing member 14 is aligned with the second drainage port 20 in the second casing member 15 so that both drainage ports 17 and 20 define the drainage port 13. The first water-blocking wall 18 of the first casing member 14 is disposed between the second water-blocking wall 23 of the second casing member 15 and the partition wall 24. Thus, a labyrinth structure is defined among the first water-blocking wall 18, second water-blocking wall 23, and partition 24 so as to restrain water from entering the casing 11 through the drainage port 13.

Figure 7:
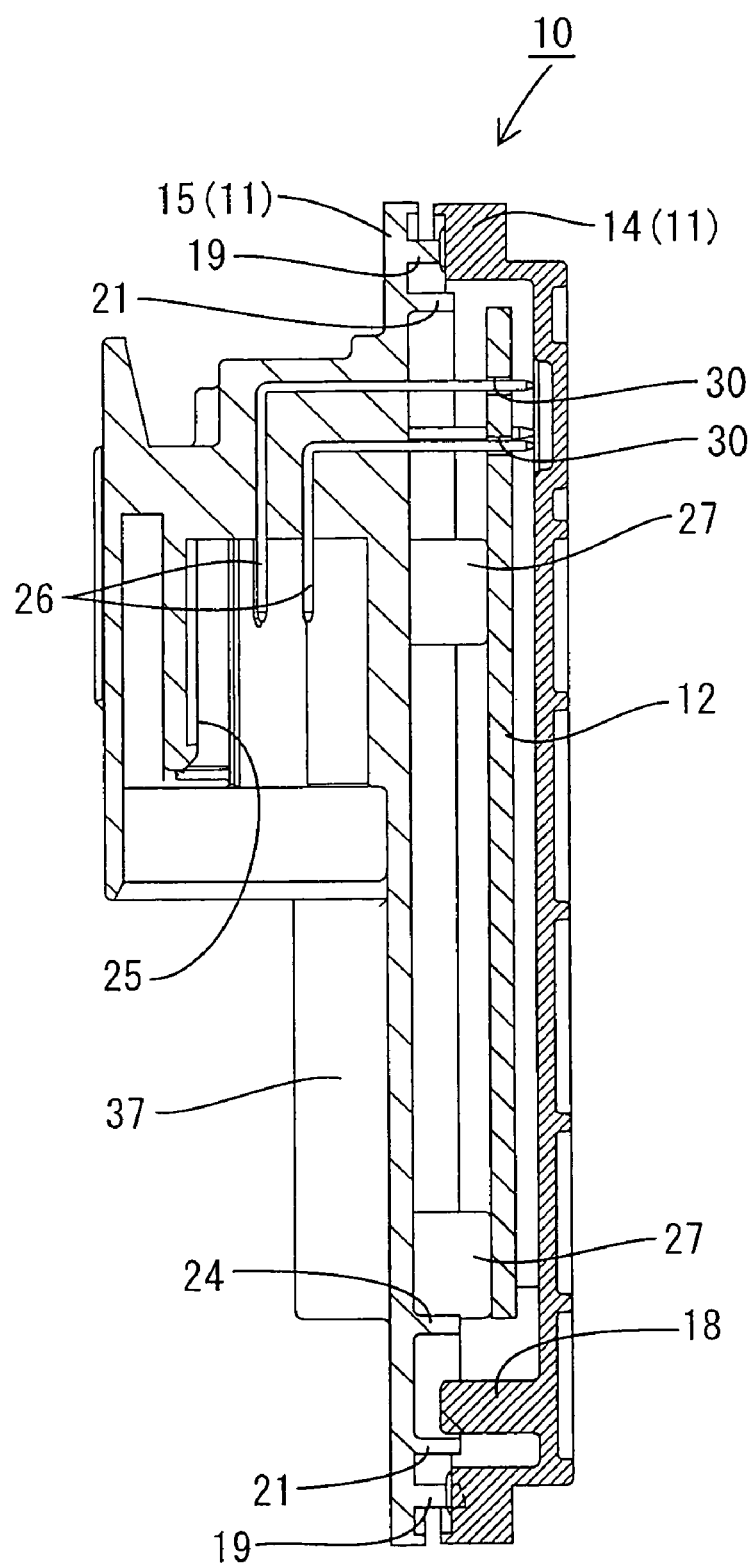
FIG. 7 a cross section view of the electrical junction box taken along lines VII-VII in FIG. 2.

As shown in FIG. 7, the second casing member 15 is provided on a front side (a left side in FIG. 7) at a position near an upper end with a plurality of connector housings 25 that project toward the front side and are open downward. As shown in FIG. 1, the four connector housings 25 are juxtaposed in a right and left direction (in a direction from the right forward side to the left backward side in FIG. 1) in the present embodiment. The respective connector housings 25 are separated by a plurality of bulkheads 42 (three bulkheads 42 in the present embodiment) from one another. The respective connector housings 25 are adapted to receive mating connectors (not shown).

As shown in FIG. 7, terminal metals 26 are disposed in the respective connector housings 25. The terminal metals 26 are bent at a substantially right angle. One end of each terminal metal 26 is directed downward (to a lower side direction in FIG. 7) to be disposed in each connector housing 25 that is open downward while the other end is directed toward a rear side (to a right side in FIG. 7) and projects toward the circuit board 12. The terminal metals 26 are insert-molded in the second casing member 15 to form a liquid-tight seal between the terminal metals 26 and the second casing member 15.

As shown in FIG. 4, the circuit board 12 is contained in the casing 11 so that the circuit board 12 stands up on the bottom wall of the casing 11. The circuit board 12 is secured by screws or bolts to bosses 27 that project from an inner wall of a front side (a left side in FIG. 4) toward a rear side (a right side in FIG. 4). The screws or bolts are omitted in the drawing.

Figure 8:
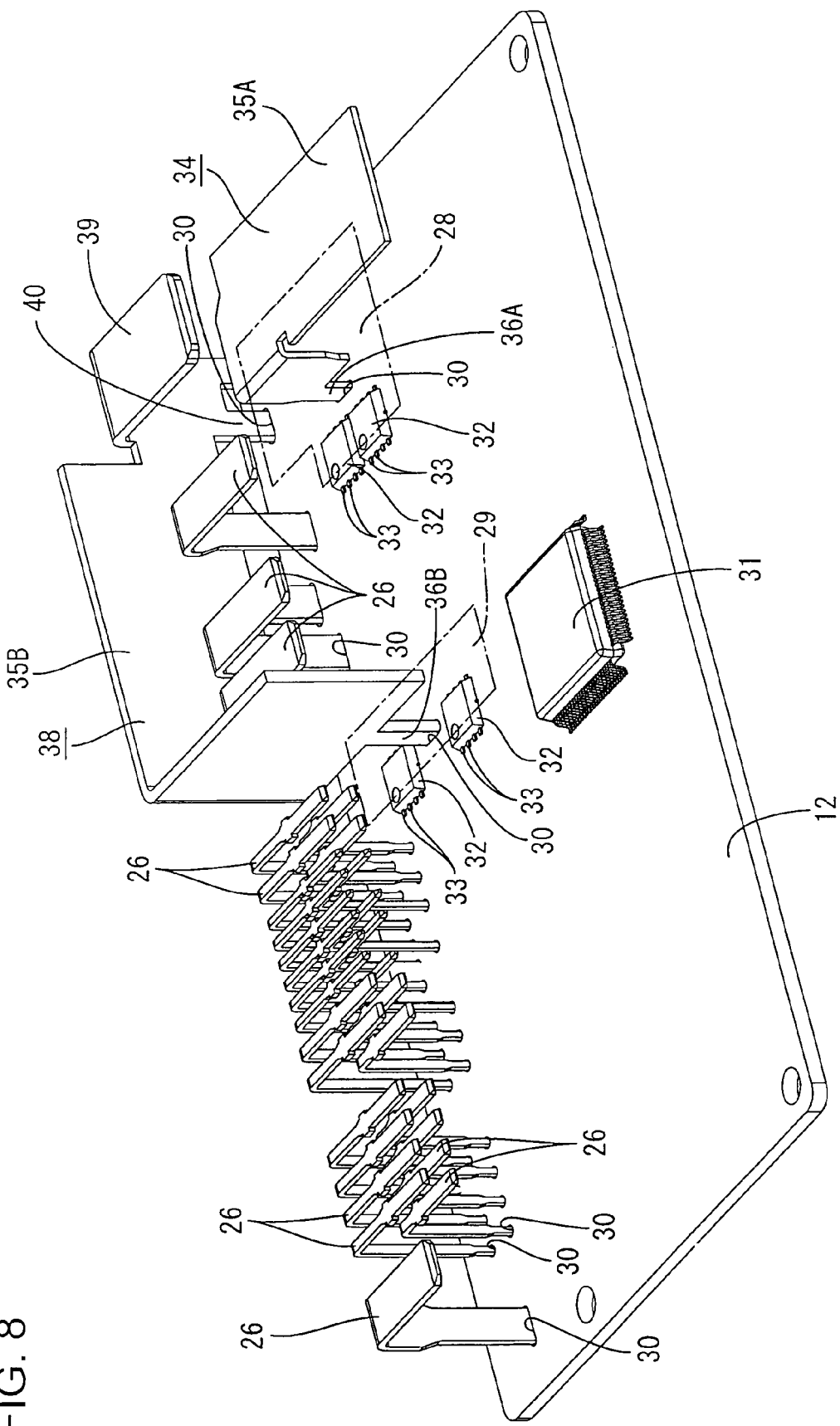
FIG. 8 is a perspective view of an embodiment of a circuit board of the electrical junction box, illustrating a connection structure among the circuit board, terminal metals, a first bus bar, and a second bus bar.

As shown in FIG. 8, the circuit board is formed into a substantially rectangular shape. Electrical conductive paths are provided on a surface (an upper side surface in FIG. 8) of the circuit board 12 by a printed wiring process. FIG. 8 illustrates a first electrical conductive path 28 (corresponding to an electrical conductive path of the present exemplary embodiment) formed near a right end side of the circuit board 12 and a second electrical conductive path 29 (corresponding to an electrical conductive path in the present invention)

formed near a central part in a right and left direction of the circuit board 12. The other electrical conductive paths are omitted in the drawing.

As shown in FIG. 8, the other end of each terminal metal 26 is inserted into a threading aperture 30 in the circuit board 12 and electrically connected to the electrical conductive path by means of soldering or the like. The terminal metals 26 are juxtaposed to be spaced away from one another in a right and left direction (from a left forward side to a right backward side).

As shown in FIG. 8, an electronic part 31 and semiconductor relays 32 (corresponding to heat generation parts in the present invention) are mounted on the surface of the circuit board 12 so that they are electrically connected to the electrical conductive paths on the circuit board. A plurality of semiconductor relays 32 (two relays 32 in the present embodiment) are connected to the first electrical conductive path 28 and second electrical conductive path 29, respectively. A plurality of leads 33 project outward from a side surface of each semiconductor relay 32. The leads 33 are connected to the respective electrical conductive paths 28 and 29 by soldering or the like.

Figure 9:
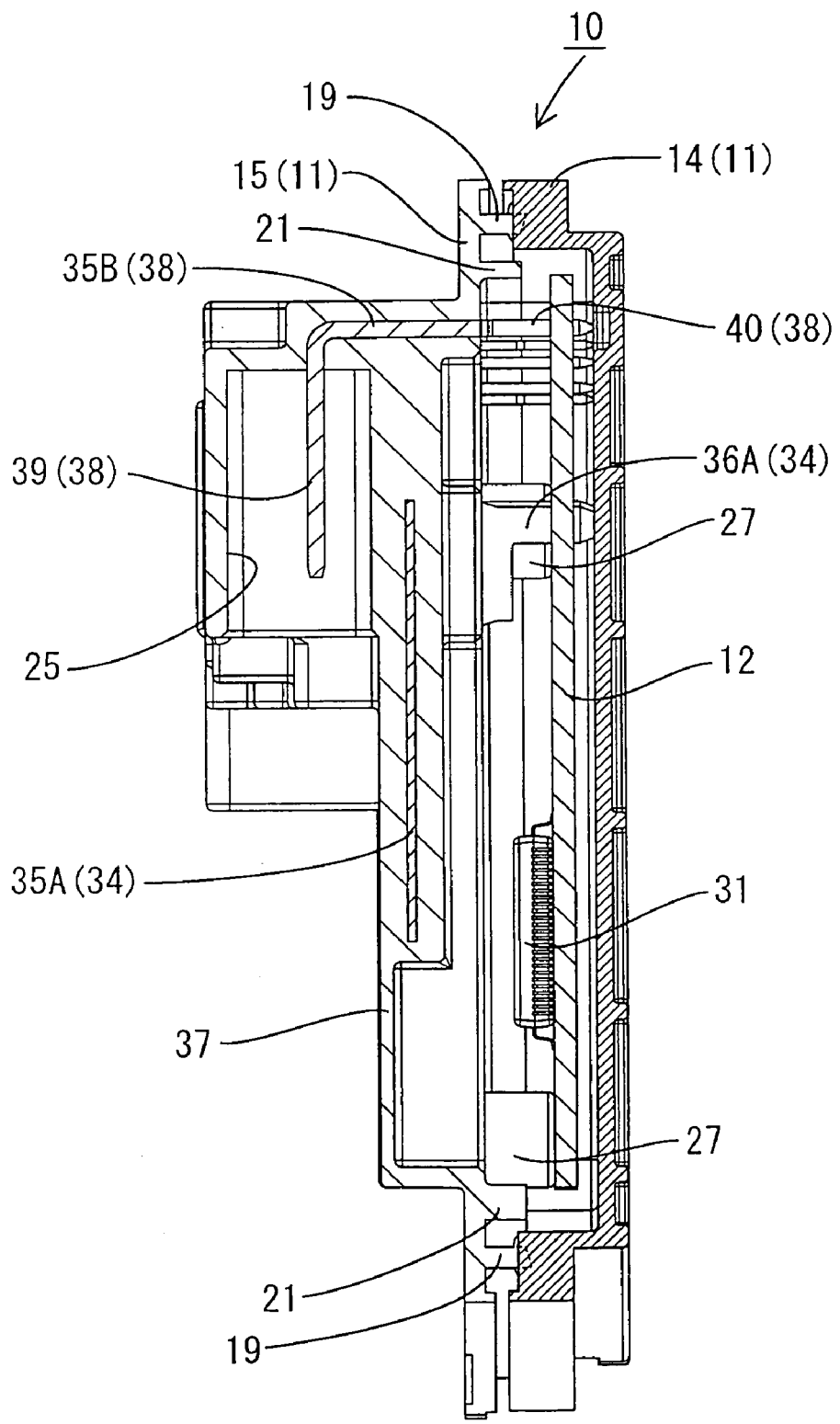
FIG. 9 is a cross section view of the electrical junction box taken along lines IX-IX in FIG. 2.
Figure 10:
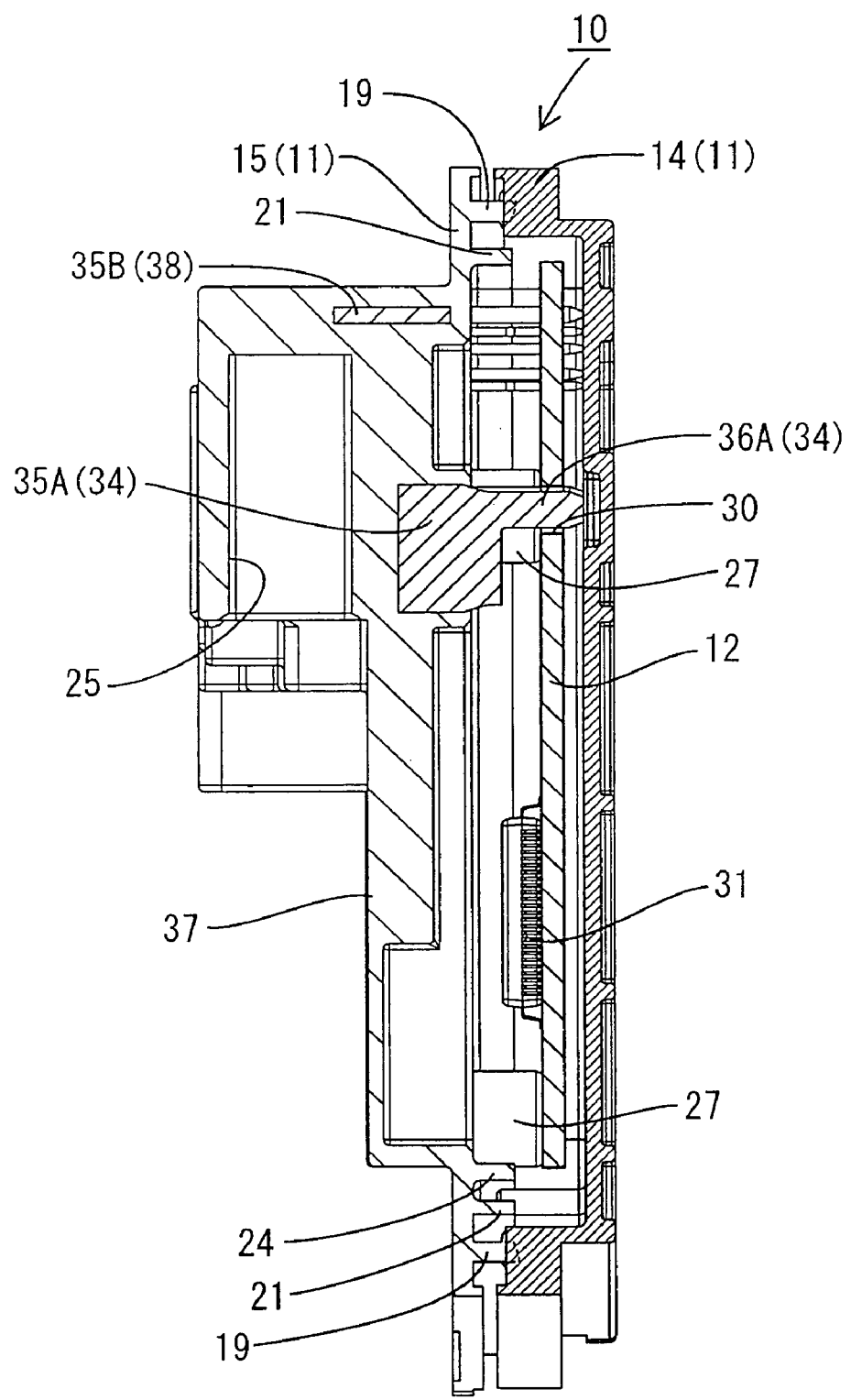
FIG. 10 is a cross section view of the electrical junction box taken along lines X-X in FIG. 2.

As shown in FIG. 8, a first bus bar 34 (corresponding to a heat radiation plate and a bus bar in the present invention) is connected to the first electrical conductive path 28 near a position where the leads 33 of the semiconductor relays 32 are connected to the first electrical conductive path 28. In the present embodiment, the first bus bar 34 is integrally formed on a heat radiation plate to serve as a heat radiation plate. The first bus bar 32 is formed into a given configuration by pressing a metal plate. As shown in FIGS. 9 and 10, the first bus bar 34 is insert-molded in the second casing member 15. The first bus bar 34 includes an embedment section 35A to be embedded in the second casing member 15 and a connecting section 36A that projects toward the circuit board 12 to be exposed outward from the second casing member 15 and to be connected to the first electrical conductive path 28.

As shown in FIG. 8, the embedment section 35A of the first bus bar 34 is formed into a substantially rectangular configuration. As shown in FIG. 9, an outer surface of the embedment section 35A is brought into close contact with the second casing member 15. The second casing member 15 is provided with a containing section 37 that projects toward a front side (a left side in FIG. 9) and contains the embedment section 35A of the first bus bar 34. As shown in FIG. 2, the embedment section 35A of the first bus bar 34 is contained in a containing section 37.

The embedment section 35A of the first bus bar 34 is provided on an end edge at a backward side in FIG. 8 with the connecting section 36A that is bent downward in FIG. 8 to project toward the circuit board 12. As shown in FIG. 10, a distal end of the connecting section 36A of the first bus bar 34 is inserted into the threading aperture 30 in the circuit board 12 near a position where the first electrical conductive path 28 is connected to the leads 33 of the semiconductor relays 32, and is connected to the first electrical conductive path 28 by means of a known process such as soldering.

The leads 33 of the semiconductor relays 32 and the connecting section 36A of the first bus bar 34 are indirectly interconnected to each other through the first electrical conductive path 28 and solders. Heat generated from the semiconductor relays 32 is transmitted to the first bus bar 34 through the leads 33, solders, first electrical conductive path 28, solders, and connecting section 36A in order. That is, the semiconductor relays 32 and first bus bar 34 are thermally connected to each other.

Although the connecting section 36A of the first bus bar 34 is connected to the first electrical conductive path 28, current does not flow into the first bus bar 34.

In the present embodiment, as shown in FIG. 2, each containing section 37 is formed near right and left end sides on the second casing member 15, respectively. FIG. 2 shows that the embedment section 35A of the first bus bar 34 is disposed in the containing section 37 at the right side. Although FIG. 2 does not show the detail structure, an embedment section of a bus bar (not shown) thermally connected to the semiconductor relays 32 on the circuit board 12 is insert-molded in the containing section 37 at the left side in FIG. 2.

As shown in FIG. 8, the second bus bar 38 (corresponding to a heat radiation plate and a bus bar) is connected to the second electrical conductive path 29 near a position where the leads 33 of the semiconductor relays 32 are connected to the path 29. In the present embodiment, the second bus bar 38 is integrally formed on a heat radiation plate to serve as a heat radiation plate. The second bus bar 38 is formed into a given configuration by means of pressing a metal plate. The second bus bar 38 is substantially disposed in a vertical direction on the surface (an upper surface in FIG. 8) of the circuit board 12.

As shown in FIGS. 9 and 10, the second bus bar 38 is insert-molded in the second casing member 15. The second bus bar 38 includes an embedment section 35B to be embedded in the second casing member 15 and a connecting section 36B that projects toward the circuit board 12 to be exposed from the second casing member 15 and is connected to the second electrically conductive path 29.

As shown in FIG. 8, the embedment section 35B of the second bus bar 38 is bent at a substantially right angle. The embedment potion 35B stands up on the circuit board 12 in a substantially vertical direction. As shown in FIGS. 9 and 10, an outer surface of the embedment section 35B and second casing member 15 are brought into close contact with each other. As shown in FIG. 2, the embedment section 35B is insert-molded in the bulkhead 42 partitioning the connector housing 25 formed in the second casing member 15. As shown in FIG. 1, the bulkhead 42, in which the embedment section 35B is insert-molded, has a dimension in width (in a direction from a right forward side to a left backward side in FIG. 1) greater than those of the other bulkheads 42.

As shown in FIG. 8, the embedment section 35B of the second bus bar 38 is provided with a terminal portion 39 that extends substantially in parallel with the circuit board 12 from an end opposite from the circuit board 13 at a right backward end side in FIG. 8. As shown in FIG. 9, the terminal portion 39 is disposed in the connector housing 25 of the second casing member 15 so that a distal end of the portion 39 is directed downward. The terminal portion 39 is electrically connected to a mating connector (not shown) to be coupled in the connector housing 25. The terminal portion 39 is connected to an electrical power source through the mating connector. Thus, the second bus bar 38 serves as an electrical power line for supplying an electrical power from the power source to the circuit board 12.

As shown in FIG. 8, the embedment section 35B of the second bus bar 38 is provided with a tab 40 that extends from an end of the circuit board 12 at a right backward side in FIG. 8 toward the circuit board 12. The tab 40 is inserted into the threading aperture 30 in the circuit board 12 and connected to the first electrical conductive path 28 by means such as soldering. Although the tab 40 is disposed at a position relatively spaced away from the semiconductor relays 32 connected to the first electrical conductive path 28 in the present embodiment, the tab 40 may be disposed near the semiconductor relays 32.

As shown in FIG. 8, the embedment section 35B of the second bus bar 38 is provided with a connecting section 36B that extends from an end of the circuit board 12 at a right forward side in FIG. 8 toward the circuit board 12. As shown in FIG. 8, a distal end of the connecting section 36B is inserted into a threading aperture 30 formed in the circuit board 12 near a position where the second electrical conductive path 29 and leads 33 of the semiconductor relays 32 are interconnected to each other, and is connected to the second electrical conductive path 29 by means such as soldering. In the present embodiment, the threading aperture 30 is formed between two semiconductor relays 32.

As shown in FIG. 8, the embedment section 35B of the second bus bar 38 is disposed above the semiconductor relays 32 connected to the second electrical conductive path 29. In other words, the embedment section 35B of the second bus bar 38 is disposed in the second casing member 15 at a position opposed to the semiconductor relays 32 connected to the second electrical conductive path 29.

As shown in FIG. 8, a portion bent downward (in a right forward direction in FIG. 8) from the embedment section 35B of the second bus bar 38 is disposed in a clearance between the plural terminal metals 26 juxtaposed on the circuit board 12.

The leads 33 of the semiconductor relays 32 are indirectly connected to the connecting section 36B of the second bus bar 38 through the second electrical conductive path 29 and solders. Heat generated from the semiconductor relays 32 is transmitted to the second bus bar 38 through the leads 33, solders, second electrical conductive path 29, solders, and connecting section 36B in order. That is, the semiconductor relays 32 and second bus bar 34 are thermally connected to each other.

The second bus bar 38 branches an electrical current from the terminal portion 39 electrically connected to the mating connector into the first electrical conductive path 28 through the tab 40 and into the second electrical conductive path 29 through the connecting section 36B.

Next, an example of an assembling process of an embodiment of the electrical junction box 10 will be described. Firstly, a metal plate is formed into a given configuration by press-working; the press-worked metal plate is disposed in dies (not shown) to be insert-molded; and forming the second casing member 15.

On the other hand, electrical conductive paths are formed on the circuit board 12 by means of a printed wiring process; the semiconductor relays 32, electronic parts 31, and the like are electrically connected to the electrical conductive paths by means of a process such as reflow soldering.

Then, the circuit board 12 is positioned so that a surface of the board that mounts the semiconductor relays 32 and the like is directed to a front side (a right side in FIG. 4); and the circuit board 12 is secured to the bosses 27 of the second casing member 15 by bolts or screws. Thus, the terminal metals 26, connecting section 36A of the first bus bar 34, connecting section 36B of the second bus bar 38, and tab 40 of the second bus bar 38 are inserted into threading apertures 30 in the circuit board 12.

Next, the electrical conductive paths on the circuit board 12 are electrically connected to the terminal metals 26, connecting section 36A of the first bus bar 34, connecting section 36B of the second bus bar 38, and tab 40 of the second bus bar 38 by means of a known process such as flow soldering.

Next, the first drainage port 17 of the first casing member 14 is aligned with the second drainage port 20 of the second casing member 15, and the welding wall 19 of the second casing member 15 is brought into contact with an opening edge of the first casing member 14. Thereafter, an attachment (not shown) clamps outer peripheries of the overlapped casing members 14 and 15 and a supersonic welding device applies vibrations (supersonic waves) to both casing members 14 and 15. Thus, a distal end of the welding wall 19 of the second casing member 15 is melted by frictional heat caused due to vibrations to be secured to the opening edge of the first casing member 14 in a liquid-tight manner. Thus, the electrical junction box 10 is completed.

Thereafter, the electrical junction box 10 is attached to a motor vehicle so that the circuit board 12 is positioned in a vertical direction with respect to the motor vehicle.

Figure 13:
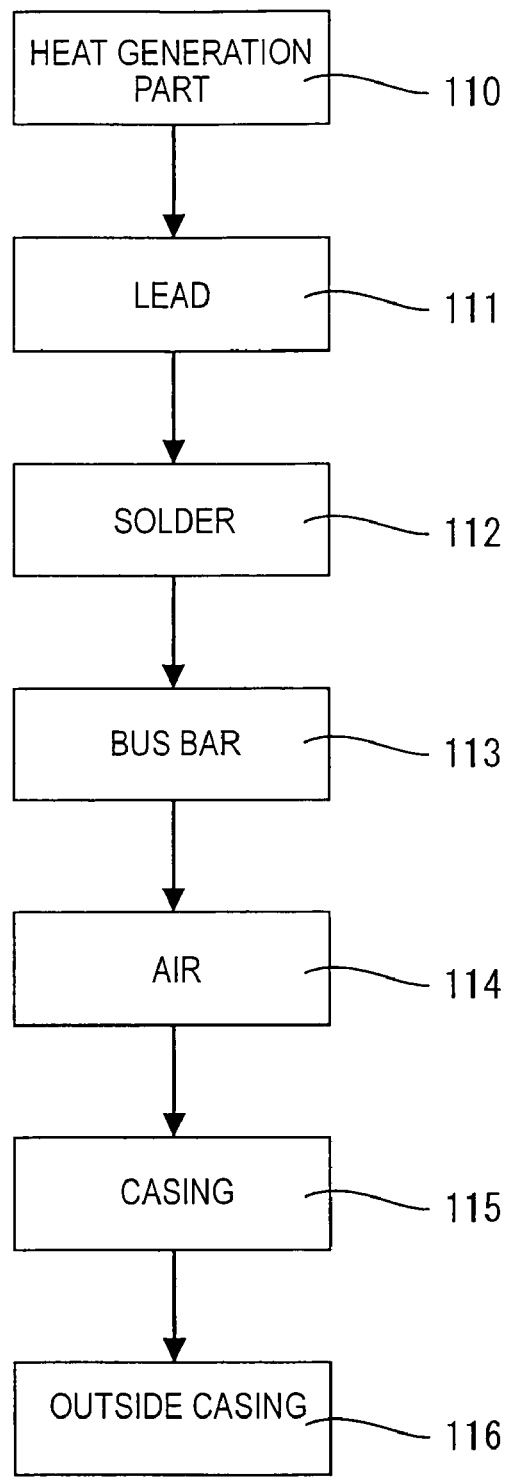
FIG. 13 is a block diagram of illustrating a heat transmission path in a prior art electrical junction box.

Next, an operation and effects of the embodiment of the electrical junction box 10 in accordance with the present invention will be described below. In the prior art, as shown in FIG. 13, heat generated from a heat generation part 110 during electrical conduction is transmitted from a lead 111 of the heat generation part 110 through a solder 112 to a bus bar 113, the heat is radiated from the bus bar 113 into air 114 in a casing 115, the heat is transmitted from the air 114 to the casing 115, and then the heat is radiated from an outer surface of the casing 115 into a casing exterior 116.

However, according to the above construction, the heat transmitted to the bus bar 113 is radiated into the air 114 in the casing 115. Since air has a relatively lower coefficient in heat conduction, there will be a problem that heat is accumulated in the casing 115 and a temperature in the casing 115 will increase. Consequently, there is a problem that an electronic part mounted on a circuit board causes malfunction or that reliability in connection of a solder will be lowered.

In view of the above problems, in the present embodiment, the first bus bar 34 and second bus bar 38 are insert-molded in the second casing member 15. Generally, the part to be insert-molded has a higher melting temperature than the housing. In this example, the bus bars are metallic, which have a higher melting temperature than the synthetic resin material used for the casing. The bus bars are then injected in a mold prior to the introduction of the melted synthetic resin material. As the synthetic resin is injected into the mold, a tight seal is formed between the casing and the bus bars. The connecting sections 36A and 36B provided on the bus bars 34 and 38 are then connected to the first electrical conductive path 28 and second electrical conductive path 29 at a position near the leads 33 of the semiconductor relays 32.

Figure 11:
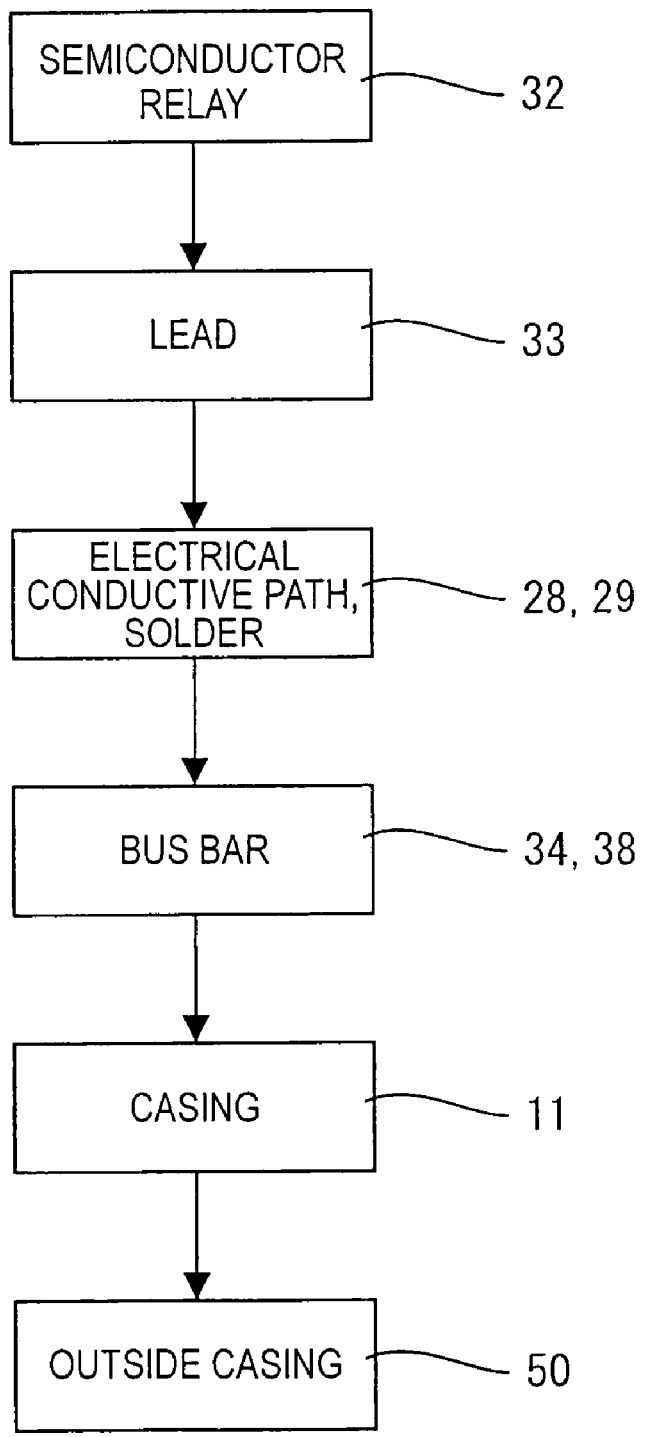
FIG. 11 is a block diagram of illustrating a heat transmission path in an embodiment of the electrical junction box in accordance with the present invention.

Thus, as shown schematically in FIG. 11, heat generated from the semiconductor relays 32 (heat generation parts) during electrical conduction is transmitted to the leads 33 of the semiconductor relays 32. The heat transmitted to the leads 33 is transmitted through solders and the electrical conductive paths 28, 29 to the connecting sections 36A and 36B of the bus bars 34 and 38. The heat transmitted to the connecting sections 36A and 36B is transmitted through the bus bars 34 and 38 to the embedment sections 35A and 35B. The heat transmitted to the embedment sections 35A and 35B is directly transmitted from an outer surface of the embedment sections 35A and 35B to the second casing member 15. The heat transmitted to the second casing member 15 is transmitted through the second casing member 15 further to the first casing member 14 to be uniformed while transmitting the whole casing 11. Thereafter, the heat is radiated from the outer surface of the casing 11 to an outside 50 of the casing 11.

Thus, according to the present embodiment, in the process of radiating the heat generated from the semiconductor relays 32 to the outside of the casing 11, it is not necessary to interpose air having a relatively lower coefficient of heat conduction between the casing 11 and the relays 32. Consequently, since it is possible to prevent heat from collecting in the casing 11, it is possible to prevent the temperature of the casing 11 from getting too hot.

Furthermore, since the heat is uniformly distributed throughout the casing 11, it is possible to further prevent an excessive temperature from developing in one part of the casing 11.

In addition, in the present embodiment, the respective connecting sections 36A and 36B of the bus bars 34 and 38 are connected to the respective electrical conductive paths 28 and 29 near a position where the leads 33 are connected to the respective electrical conductive paths 28 and 29. Thus, heat generated from the semiconductor relays 32 is transmitted from the leads 33 to the respective electrical conductive paths 28 and 29 and from the respective electrical conductive paths 28 and 29 to the connecting sections 36A and 36B. Since the respective electrical conductive paths 28, 29 and connecting sections 36A, 36B are interconnected near a position where the leads 33 are connected to the respective electrical conductive paths 28, 29, the heat is relatively smoothly transmitted from the leads 33 to the connecting sections 36A, 36B. Consequently, since it is possible to prevent heat from building up in the first electrical conductive path 28 or the second electrical conductive path 29, it is possible to further prevent an excessive temperature from building up in the casing 11.

Also, by altering the size and a shape of each of the bus bars 34 and 38 in accordance with an amount of heat generation of the semiconductor relays 32, it is possible to effectively radiate heat.

According to the present embodiment, the first bus bar 34 and second bus bar 36 are insert-molded in the second casing member 15. The connecting section 36A of the first bus bar 34 and the connecting section 36B of the second bus bar 38 are connected to the first electrical conductive path 28 to which the leads 33 of the semiconductor relays 32 are connected. Thus, after the heat generated from the semiconductor relays 32 is transmitted to the first electrical conductive path 28, the heat is transmitted to the first bus bar 34 and second bus bar 38. Thus, it is possible for the present embodiment to enhance a heat radiation function in comparison with heat transmission using a single bus bar.

In the present embodiment, the embedment section 35B of the second bus bar 38 is disposed in the second casing member 15 at a position opposed to the semiconductor relays 32. Thus, the heat generated from the semiconductor relays 32 flows from the semiconductor relays 32 to an inner surface of the second casing member 15 opposed to the semiconductor relays 32 by means of radiation. Thereafter, heat is transmitted through the second casing member 15 to the embedment section 35B of the second bus bar 38. The heat transmitted to the embedment section 35B of the second bus bar 38 is uniformly transmitted to the second bus bar 38. Thus, according to the present embodiment, it is possible to uniformly distribute the heat generated from the semiconductor relays 32.

Also, in the present embodiment, because the bus bars 34 and 38 are integrated with the heat generation plates, it is possible to save space in comparison to having the bus bars separated from the heat radiation plates.

Also, in the present embodiment, the second bus bar 38 is disposed on the circuit board 12 in a substantially vertical direction. Thus, it is possible to reduce a projected area in a direction intersecting the surface of the circuit board 12 in comparison with the case where the second bus bar 38 is disposed in parallel to the surface of the circuit board 12.

Also, in the present embodiment, the second bus bar 38 is disposed in a clearance between the juxtaposed plural terminal metals 26. Thus, since it is possible to effectively utilize the clearance between the terminal metals 26 that has been a dead space in the prior art, it is possible to have a more efficient use of the available space.

Also, in the present embodiment, a plurality of connector housings 25 are partitioned by bulkheads 42 to be juxtaposed in the second casing member 15 and the embedment section 35B of the second bus bar 38 is insert-molded in the bulkheads 42. Thus, it is possible to dispose the embedment section 35B of the second bus bar 38 in the bulkheads that have been a dead space in the prior art. Thus, it is possible to have a more efficient use of space.

Also, in the present embodiment, the bus bars 34 and 38 are thermally connected to the semiconductor relays 32. Thus, since the bus bars 34, 38 and heat radiation plates can transmit the heat from the semiconductor relays 32, it is possible to generally enhance the heat radiation function.

Also, in the present embodiment, the second bus bar 38 constitutes an electrical power line for supplying electrical power from an electrical power source to the circuit board 12. A relatively great amount of electrical current is supplied to the electrical power line to which electrical power from an electrical power source is supplied. Consequently, the electrical power line generates heat. According to the above construction, the heat generated upon electrical conduction from the second bus bar 38 that constitutes the electrical power line is transmitted to the casing 11 and then is radiated outward from the casing 11. Thus, it is possible to generally enhance the heat radiation function.

Also, in the present embodiment, the casing 11 is provided on the inner surface of the bottom wall with the slopes 16, the slopes 16 are provided on the lowest part with the drainage port 13 that drains water in the casing 11 outward, and the casing 11 is formed in a liquid-tight manner except the drainage port 13. Thus, for example, condensation formed in the casing 11 flows toward the bottom wall of the casing 11, flows on the slopes 16 on the bottom wall, and is drained out through the drainage port 13 that is open at the lowest part from the casing 11.

Since the casing 11 is formed in a liquid-tight manner, except the drainage port 13, it is possible to prevent water from entering the casing 11 through a portion other than the drainage port 13.

However, if the casing 11 is formed in liquid-tight manner, except the drainage port 13, as constructed above, air flow between the interior of the casing 11 and the exterior of the casing 11 is prevented. Furthermore, the first water-blocking wall 18 and second water-blocking wall 23 are formed in a complicated manner above the drainage port 13. Thus, although it is possible to restrain water from entering the casing 11, at the same time it is possible to restrain cool air from entering the casing 11. In the results, the heat radiated into the air in the casing 11 is likely to be accumulated in the casing 11.

However, if an opening is provided in the casing 11 in order to radiate the heat accumulated in the casing 11 to the outside, water will likely enter the casing through the opening. Thus, waterproofing the casing results in an undesired increase in heat retention.

In the present embodiment, it is possible to radiate the heat generated from the semiconductor relays 32 to the outside of the casing 11 without having air enter the casing 11. Consequently, even if the casing 11 has a construction in which heat is likely to build up, it is possible to effectively prevent an undesirable increase in temperature.

Also, according to the present embodiment, even if the semiconductor relays 32 having a great amount of heat generation are used as a heat generation part, it is possible to prevent the casing temperature from getting to high.

It should be noted that the present invention is not limited to the embodiment described above and illustrated in the drawings. For example, the following embodiments will fall in the technical scope of the present invention.

Figure 12:
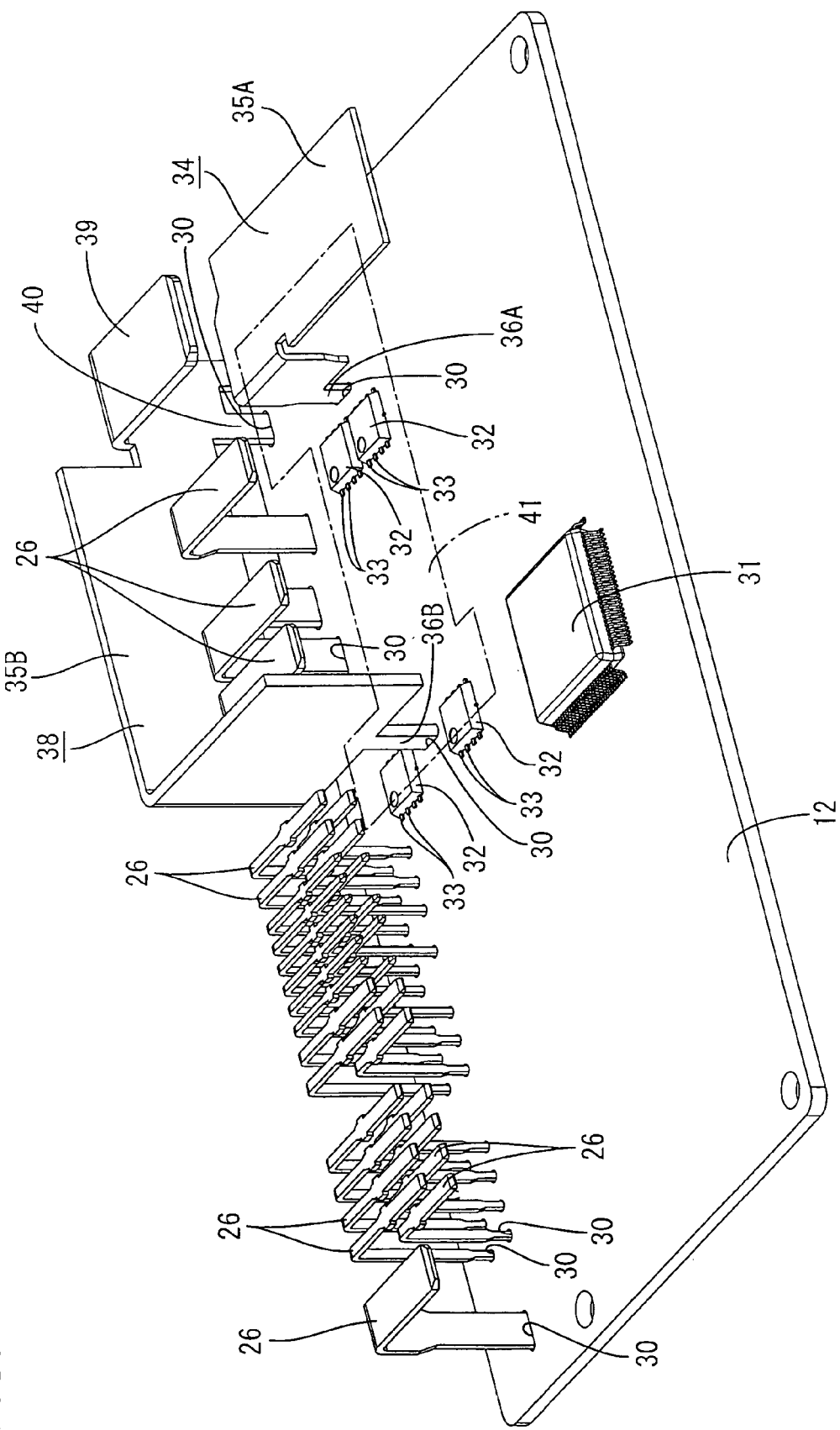
FIG. 12 is a perspective view of another embodiment (1) of a circuit board of the electrical junction box in accordance with the present invention, illustrating a connection structure among the circuit board, terminal metals, a first bus bar, and a second bus bar.

(1) Although the first bus bar 34 and second bus bar 38 are connected to the first electrical conductive path 28 and second electrical conductive path 29 formed on the circuit board 12 in the present embodiment, the present invention is not limited to this embodiment. A third electrical conductive path 41 (corresponding to an electrical conductive path in the present invention) having a pattern shown in FIG. 12 may be formed on the surface of the circuit board 12 and the first bus bar 34 and second bus bar 38 may be connected to the third electrical conductive path 41. The electrical conductive path to be formed on the surface of the circuit board 12 can adopt any pattern in accordance with needed requirements.

(2) Although the semiconductor relays are used as heat generation parts in the present embodiment, the present invention is not limited to this embodiment. The heat generation parts may be mechanical relays. So long as any parts generate heat during electrical conduction, any electronic parts may be used, in accordance with needed requirements.

(3) Although the circuit board 12 is disposed vertically in the casing 11 in the present embodiment, the present invention is not limited to this embodiment. The circuit board 12 may be disposed horizontally in the casing 11 or at any posture in the casing 11 in accordance with requirements.

(4) Although the respective connecting sections 36A and 36B of the respective bus bars 34 and 38 are thermally connected through the respective electrical conductive paths 28 and 29 to the semiconductor relays 32 in the present embodiment, the present invention is not limited to this embodiment. The connecting sections of the bus bars may be connected directly to the leads of the semiconductor relays by means of soldering, welding, or the like.

Also, the connecting sections of the bus bars may be spaced away from the semiconductor relays opposite each other, and the heat generated from the semiconductor relays may be transmitted to the connecting sections of the bus bars by means of radiation.

(5) Although the first casing member 14 and second casing member 15 are coupled to each other in a liquid-tight manner at all areas other than the drainage port 13 by means of a supersonic welding process in the present embodiment, the present invention is not limited to this embodiment. A packing may be interposed between the opening edge of the first casing member 14 and the opening edge of the second casing member 15 to couple them in a liquid-tight manner. The first and second casing members 14 and 15 may be connected by an adhesive. The first and second casing members 14 and 15 may be connected by means of a laser-welding process. Thus, the first casing member 14 and second casing member 15 may be coupled to each other by means of any process in accordance with the needed requirements.

(6) Although the first casing member 14 and second casing member 15 are coupled to each other in a liquid-tight manner at all areas other than the drainage port 13 in the present embodiment, the present invention is not limited to this embodiment. The first casing member 14 and second casing member 15 may be coupled integrally to each other, when lock projections provided on one of the members are elastically engaged with lock projections provided on the other member. Also, they may be coupled to each other by bolts or screws. Any assembling structure can be used in accordance with the needed requirements.

(7) Although the first bus bar 34 and second bus bar 38 are integrated to the heat radiation plate to serve as the heat radiation plate in the present embodiment, the present invention is not limited to this embodiment. The first bus bar 34 and second bus bar 38 may be separated from the heat radiation plate. In the case where outer surfaces of the semiconductor relays 32 are made of insulation materials, the connecting section of the heat radiation plate may be contacted with the outer surfaces of the semiconductor relays 32. At the time, the heat radiation plate may not be electrically connected to the circuit board 12.

(8) Although the first bus bar 34 and second bus bar 38 are thermally connected to the semiconductor relays 32 in the present embodiment, the present invention is not limited to this embodiment. In the case where a heat radiation plate separated from the bus bars 34 and 38 is thermally connected to the semiconductor relays 32, the bus bars 34 and 38 may not be thermally connected to the semiconductor relays 32.

What is claimed is:

1. An electrical junction box comprising:
a casing made of a synthetic resin material;
a circuit board contained in said casing;
a heat generation part mounted on said circuit board;
a heat radiation plate insert-molded in said casing, the heat radiation plate including:
an embedment section embedded in said casing by insert-molding; and
a connecting section that is not embedded in said casing, wherein the connecting section is thermally connected to said heat generation part; and
a bus bar that is electrically connected to said circuit board and is contained in said casing,
wherein:
said bus bar and said heat radiation plate are formed by a single plate,
said bus bar is disposed on said circuit board in a substantially vertical direction, and
a plurality of terminal metals are juxtaposed on said circuit board, and said bus bar is disposed in a clearance between said terminal metals.

2. An electrical junction box comprising:
a casing made of a synthetic resin material;
a circuit board contained in said casing;
a heat generation part mounted on said circuit board; and
a heat radiation plate insert-molded in said casing, the heat radiation plate including:
an embedment section embedded in said casing by insert-molding; and
a connecting section that is not embedded in said casing, wherein the connecting section is thermally connected to said heat generation part,
wherein said embedment section of said heat radiation plate is disposed in said casing at a position opposed to said heat generation part, and
wherein a plurality of connector housings are partitioned by a plurality of bulkheads to be juxtaposed in said casing, each connector housing is adapted to be coupled to a mating connector, and a bus bar is insert-molded in one of said bulkheads.

3. An electrical junction box comprising:
a casing made of a synthetic resin material;
a circuit board contained in said casing;
a heat generation part mounted on said circuit board; and
a heat radiation plate insert-molded in said casing, the heat radiation plate including:
an embedment section embedded in said casing by insert-molding; and a connecting section that is not embedded in said casing, wherein the connecting section is thermally connected to said heat generation part, wherein said casing is provided on an inner surface of a bottom wall with a slope, said slope is provided in the lowest part with a drainage port so that water in said casing is drained outside, and said casing is formed in a liquid-tight manner at an area different from said drainage port.

* * * * *